United States Patent [19]

Nishioka et al.

[11] Patent Number: 5,508,658
[45] Date of Patent: Apr. 16, 1996

[54] POWER AMPLIFIER CIRCUIT FOR AUDIO SIGNAL AND AUDIO DEVICE USING THE SAME

[75] Inventors: Kei Nishioka; Masanori Fujisawa, both of Kyoto, Japan

[73] Assignee: Rohm Co., Ltd., Kyoto, Japan

[21] Appl. No.: 426,832

[22] Filed: Apr. 24, 1995

[30] Foreign Application Priority Data

Apr. 27, 1994 [JP] Japan ................... 6-112036

[51] Int. Cl.⁶ .................................. H03F 3/26
[52] U.S. Cl. .................. 330/273; 330/146; 330/297
[58] Field of Search .................. 330/124 R, 146, 330/202, 267, 273, 295, 297; 381/120, 121

[56] References Cited

U.S. PATENT DOCUMENTS

| | | | |
|---|---|---|---|
| 4,218,660 | 8/1980 | Carver | 330/263 X |
| 4,472,687 | 9/1984 | Kashiwagi et al. | 330/263 X |
| 4,507,619 | 3/1985 | Dijkstra et al. | 330/297 |
| 4,752,747 | 6/1988 | Botti et al. | 330/297 |
| 5,075,634 | 12/1991 | French | 330/297 X |
| 5,200,711 | 4/1993 | Andersson et al. | 330/297 X |

OTHER PUBLICATIONS

U.S. Ser. No. 08/199,890 filed Feb. 22, 1994 to K. Nishioka et al.
U.S. Ser. No. 08/203,307 Mar. 1, 1994 to K. Nishioka et al.

*Primary Examiner*—James B. Mullins
*Attorney, Agent, or Firm*—Fay, Sharpe, Beall, Fagan, Minnich & McKee

[57] ABSTRACT

A power amplifier circuit for an audio signal is provided with a switching control circuit and a switching circuit between an amplifier and a power source line or ground line and a smoothing circuit which smoothes current from the switching circuit and supplies the current to the amplifier, and the smoothing circuit is provided with a change-over switching circuit which operates to return a commutation current generated during switching OFF time to the smoothing circuit.

13 Claims, 8 Drawing Sheets

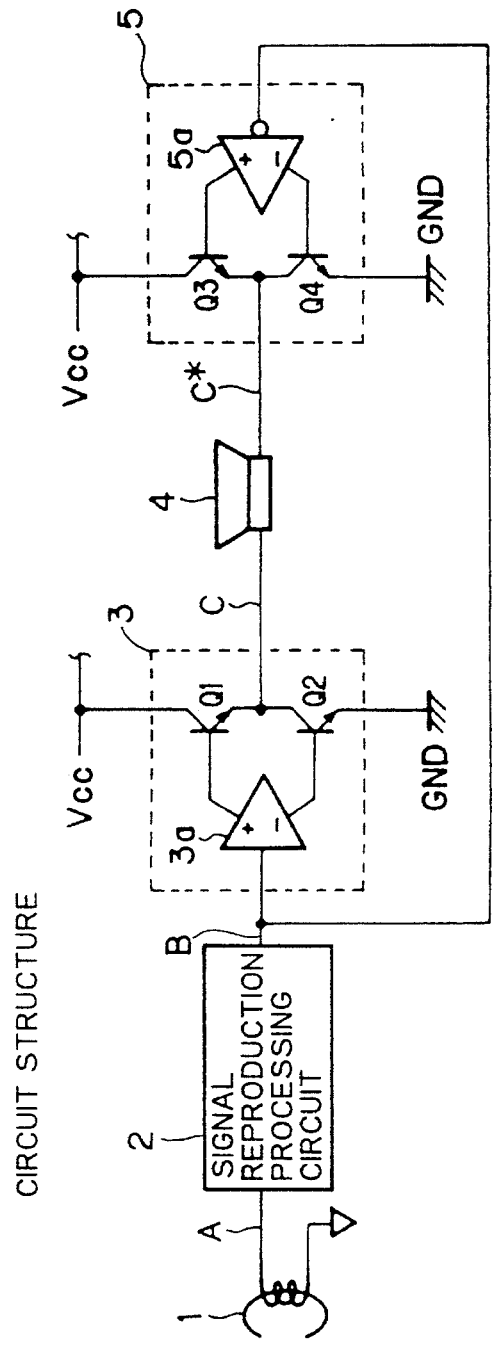
FIG.9(a) CIRCUIT STRUCTURE
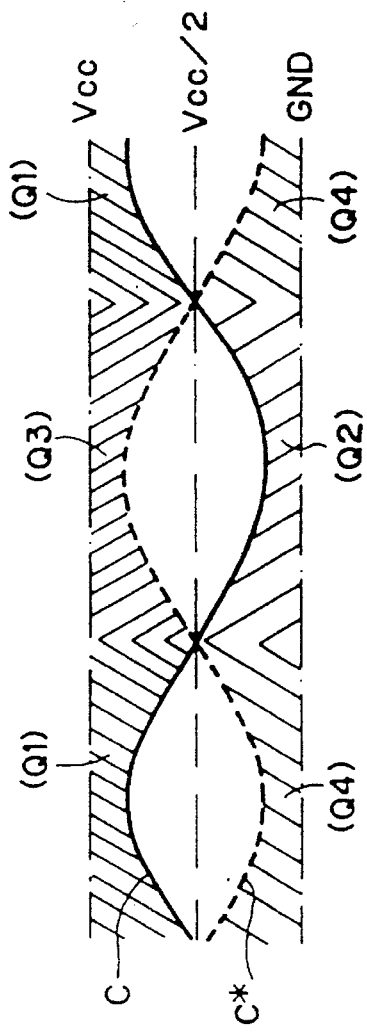
FIG.9(b) WAVEFORM EXAMPLE

POWER AMPLIFIER CIRCUIT FOR AUDIO SIGNAL AND AUDIO DEVICE USING THE SAME

BACKGROUND OF THE INVENTION

1. Technical Field

The present invention relates to a power amplifier circuit for an audio signal and an audio device using the same and, particularly, to a power amplifier circuit capable of reducing power consumption in a Balanced Transformer Less (BTL) type output circuit of an audio device, particularly, a portable audio device, such as a radio receiver, a cassette tape player, video tape recorder, a video camera or a component stereo device, which generates an audio signal.

2. Background Art

FIG. 9(a) shows a schematic block circuit diagram of a signal reproducing system in a conventional portable cassette tape player as an example of an audio device using the BTL output circuit. 1 depicts a read head, 2 a signal reproduction processing circuit including a head amplifier and an equalizer circuit, etc., 3 an output stage amplifier of positive phase side (non-inverted output side), 4 a loud speaker as a load and 5 an output stage amplifier of negative phase side (inverted output side).

During reproduction, the audio signal recorded on a tape (not shown) is read out therefrom through the read head 1 as a read signal A which is an input audio signal. The read signal A is inputted to the signal reproduction processing circuit 2 in which a high frequency bias component applied during recording is removed and, after equalization processing, outputted as an audio signal B. The thus reproduced audio signal B is finally amplified by the output stage amplifiers 3 and 5 in which output signals C and C* are produced and the loud speaker 4 is driven by these outputs. As a result, a reproduced sound is generated by the loud speaker 4.

It is usual that the transistor amplifiers 3 and 5 include in their input stages input stage amplifiers 3a and 5a for producing a pair of signals. The audio signal B is amplified by the input stage amplifier 3a and made into a pair of signals whose phases are different from each other by 180°. These signals are amplified by push-pull transistors Q1 and Q2 which constitute an output stage amplifier to provide the amplified output signal C. The audio signal B is inverted and amplified by the input stage amplifier 5a, amplified similarly by push-pull transistors Q3 and Q4 and power-amplified to provide the output signal C*.

When describing in detail the power amplification in the output stage amplifier 3 as an example, the voltage of a power source line Vcc which feeds the output stage amplifier 3 in accordance to the input signal B is lowered by the transistor Q1 to a voltage level of the output signal C. In other words, the output signal C is produced as a result of voltage drop by an amount of an internal impedance of the transistors Q1 and is changed according to a waveform of the audio signal B. In this case, the transistors Q1 handles a voltage difference between the power source line voltage Vcc and the voltage of the output signal C. As a result, the transistor Q1 consumes a power corresponding to the voltage difference.

Although the output stage amplifier is shown in the figure as comprising a simple circuit including the output transistors Q1 and Q2, a peripheral circuit including a drive circuit, etc., may be included in a practical circuit construction. The above matter is the same for the output stage amplifier 5.

Particularly, in the case of the BTL circuit, although the input stage amplifiers 3a and 5a are constructed by differential amplifiers and there is provided negative feedback from output terminals of the amplifiers 3 and 5 to the inverted input side of the input differential amplifiers 3a and 5a to which a reference voltage (corresponding to Vcc/2 where a Vcc is power source voltage) is supplied, such is omitted in the figure since it has no direct relation to the present invention.

Describing the operation of the BTL output stage amplifiers 3 and 5 in detail, when a voltage value of the audio signal B is higher than the reference voltage (Vcc/2), the transistor Q1 on the side of the power source is made active by the output of the input stage amplifier 3a and the transistor Q2 on the ground side is cut off. Further, the transistor Q3 on the side of the power source is cut off and the transistor Q4 on the ground side is made active by the output of the input stage amplifier 5a. And, current corresponding to the voltage value of the audio signal B flows from the power source line Vcc through the transistor Q1, the loud speaker 4 and the transistor Q4 to ground.

When the voltage value of the audio signal B is lower than the reference voltage, the ON and OFF operations of the transistors are reversed with respect to those mentioned above and current corresponding to the voltage value of the audio signal B flows from the power source line Vcc through the transistor Q3, the loud speaker 4 and the transistor Q2 to ground.

When the voltage value of the audio signal B is equal to the reference voltage, the respective transistors are in an OFF state. In this case, due to the negative feedback to the input stage amplifiers 3a and 5a, output terminals of the amplifiers 3 and 5 become Vcc/2, respectively.

Power consumed by the respective transistors Q1, Q2, Q3 and Q4 when the pair of output stage amplifiers 3 and 5 which operate in negative phase each other are provided and are operated in BTL operation in this manner is shown by hatching in FIG. 9(b). In this figure, power consumption of the respective transistors is shown by areas hatched with lines in different directions.

Power caused by the voltage drop in the output transistors shown by the hatching is dissipated by the power amplifier transistor as heat. Therefore, transistors whose power loss is large are required. Since a large power is consumed there, power efficiency in the case of the production of the output signals C and C* by the BTL circuit is low.

This fact is a problem, in particular for a portable audio device which is operated by a battery of limited capacity since an operating time thereof depends upon the efficient utilization of power. Further, for such a device, it is very important, as a commercial product, that it is operable for a long period of time. Therefore, power consumption of the device should be as small as possible.

For fulfilling these demands the present assignee has already filed two U.S. patent applications of U.S. Ser. No. 08/199890 and U.S. Ser. No. 08/203307 for switching regulator type power amplifier circuits.

SUMMARY OF THE INVENTION

An object of the present invention is to provide a power amplifier circuit for an audio signal, which is capable of reducing power consumption of an output circuit thereof.

Another object of the present invention is to provide a power amplifier circuit for an audio signal of a BTL type, which can use transistors whose power loss is small, by reducing power consumption of the transistors of the output circuit thereof.

A further object of the present invention is to provide an audio device capable of reducing power consumption of a BTL output circuit thereof.

A still further object of the present invention is to provide an audio device which is suitable as a portable device.

The power amplifier circuit for an audio signal and the audio device using the same according to the present invention, which achieves the above objects, is featured by comprising: a first amplifier for amplifying an audio signal; a second amplifier for amplifying the audio signal; a first switching circuit including a ramp wave generator circuit oscillating at a frequency in a range from 50kHz to 800kHz, a comparator having one input supplied with an output of the ramp wave generator circuit and another input supplied with a control signal and a switching transistor for ON/OFF switching of power source line in accordance with an output of said comparator for feeding power to one of the first amplifier and the second amplifier; a smoothing circuit having a coil provided between the feed power output of the first switching circuit and a terminal of one of the first amplifier and the second amplifier for receiving a feed power; a second switching circuit for forming a circulating path in accordance with the half cycle of the audio signal to supply one of the first amplifier and the second amplifier with a current of the coil in a period when the switching transistor is in an OFF state; a control circuit including a control voltage value generator circuit for generating a voltage value corresponding to a voltage difference between a voltage signal of the feed power and a selected voltage of one of a first output signal of the first amplifier and a second output signal of the second amplifier as the control signal and supplying the voltage value to the another input of the comparator to control the comparator output for controlling a switching period of the switching transistor such that the voltage difference between the voltage of one of the first output signal and the second output signal and the voltage of the feed power becomes substantially constant.

Further, through the provision of the like switching circuit and the control circuit between the amplifiers 3 and 5 and the ground side, and through the replacement of the voltage of the feeding power with a voltage for a ground current sinking from the amplifiers 3 and 5 to ground, the power due to sinking current to ground is likely controlled thereby reduction of the power consumption is realized By providing respectively such a switching control circuit which performs the above explained control and such a switching circuit between the first or second amplifiers and the power source line (or ground line), the feeding power to the amplifiers (or sinking power to ground) is generated by a switching control. Further, the voltage of the feeding power to the amplifiers (or the voltage of the sinking power to ground) is fedback correspondingly to the voltage of the audio signal. Therefore, it is possible to keep the voltage difference between the voltages of the feeding power and the output signal of the amplifier constant. Further, if the constant voltage difference is kept at a minimum voltage necessary for the operation of the amplifier or at a constant value more than the minimum voltage within a low voltage range, the power consumption is further reduced.

The constant voltage difference (target value) corresponds, in the amplifier, to a voltage drop for generating the output signal. Therefore, in this case, the amplification is performed while the voltage drop in the amplifiers is kept at the minimum voltage or at the constant low voltage (target value) but more than the minimum voltage. A current value of the output signal in this case is determined by the power supplied from the switching circuit and corresponds to the input audio signal. Accordingly, power consumption of the amplifier in this case is substantially determined by the above mentioned constant voltage (target value).

Further, the switching circuit is controlled ON/OFF in correspondence with half cycle amplified output of either of the BTL type push-pull outputs to form a circulating passage when the switching transistor is turned OFF. Thereby, the number of diodes which are used for forming the circulating passage is reduced and the power consumed in the commutation diodes is as well reduced.

On the other hand, a total power loss of the switching circuit and the control circuit, for switching the power source line voltage Vcc, is mainly generated transiently only at the switching time since an ON resistance of a switching transistor thereof is low. The power loss is very minor compared with the conventional system in which such loss is generated always. An increase of power consumption due to this is relatively small compared with power consumption in the power amplifier stage.

BRIEF DESCRIPTION OF THE DRAWINGS

FIGS. 9(a) and 9(b) are views for explaining a portable cassette tape player using a BTL output circuit, wherein FIG. 9(a) is a block diagram thereof and FIG. 9(b) is a view for explaining the power consumption in the output stage transistor.

DESCRIPTION OF THE PREFERRED EMBODIMENTS

Figure 1:
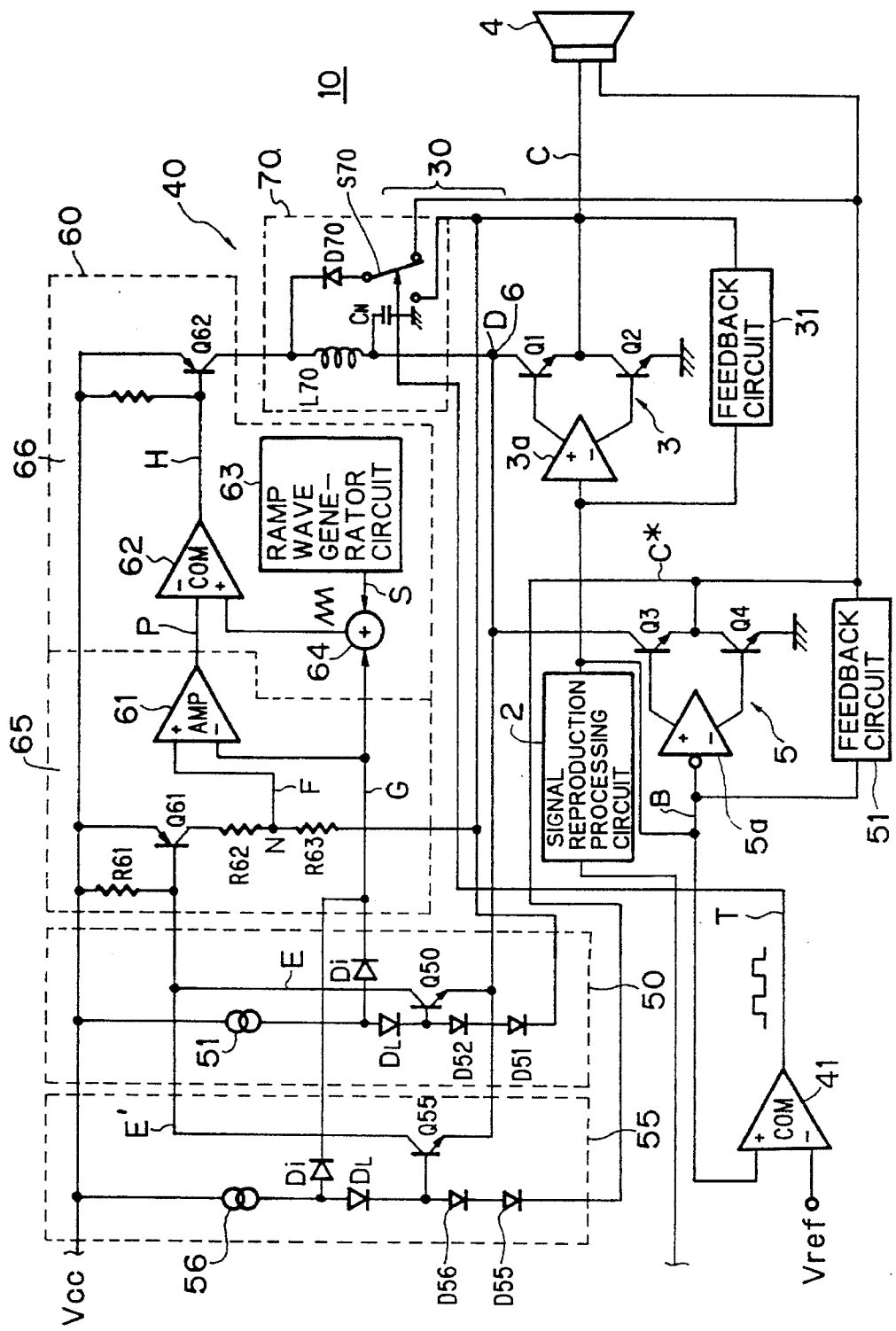
FIG. 1 is a block diagram of an audio device according to an embodiment of the present invention when applied to a portable cassette tape player.

In FIG. 1, an output stage circuit 30 is an output stage amplifier circuit of a portable cassette tape player 10 in which the supply power control circuits 40 for supplying power to the amplifiers 3 and 5 shown in FIG. 9(a) is provided in common to the respective amplifiers. Further, the amplifier 3 is provided with a circuit 31 operating as a feedback circuit and the amplifier 5 is also provided with a circuit 51 operating as a feedback circuit. Further, the same circuit construction and components thereof that are shown in FIG. 9(a) are depicted by the same reference numerals, respectively. Therefore, detailed descriptions thereof are omitted. Although not shown, a power source line Vcc is connected to a + side output voltage line of a battery in a portable audio device.

The supply power control circuit 40 is a power control circuit which performs switching regulation over an output power under control of pulse width modulation (PWM) such that voltage of the output power is maintained at a constant value (target value) with respect to an output voltage of an audio signal. A supply current control is performed correspondingly to a variation of the internal impedance of an output transistor Q1 which is determined corresponding to a signal level of an input signal. For this purpose, a voltage of the output power and a voltage of an output signal C are detected. And, a power corresponding to a difference therebetween representing the predetermined target value is supplied to the transistor Q1 and a control is performed such that a potential difference between an output side of the transistor Q1 and a power supply terminal becomes substantially constant, through which a power corresponding to the input signal (or output signal) is at the same time supplied.

This circuit 40 is composed of a detection circuit 50, a switching regulation circuit 60 and a smoothing circuit 70. A capacitor CN in the circuit is for by-passing high frequency signal and has a capacitance of in the order of 2000 Pf. This capacitor is theoretically unnecessary.

The switching regulation circuit 60 is a circuit inserted in between the power source line Vcc and a power supply terminal (output terminal 6) to the amplifier 3. This is composed of a control voltage value generating circuit 65 and a switching circuit 66. The control voltage value generating circuit 65 has a transistor Q61 and an amplifier 61 and generates a control voltage value for the switching control. The switching circuit 66 includes a comparator 62, a PNP type switching transistor Q62 and a ramp wave generator circuit 63, and controls the ON/OFF switching of the power supply line connected to the power source line Vcc by the transistor Q62 and further sends a resultant power to the output terminal 6 through the smoothing circuit 70. This becomes a supply power D for the amplifier 3 which is generated at the output terminal 6.

Under control of the supply power control circuit 40, the voltage at the output terminal 6 is changed according to the level of the output signal C. However, since the potential difference between the output terminal 6 and the output terminal of the output signal of the transistor Q1 is maintained substantially constant (target value), power consumption in the transistor Q1 is reduced as mentioned previously. That is, in this case, when the signal level of the output signal C is low, the voltage at the output terminal 6 becomes low correspondingly. When the signal level of the output signal C is high, the voltage at the output terminal 6 becomes high correspondingly.

A total power consumption of the supply power control circuit 40 and the transistor Q1 must be smaller than that consumed by the conventional transistor Q1. This can be achieved by selecting a high frequency as the switching frequency, for example, making it as high as 50kHz to 800kHz, and by maintaining the potential difference between the output terminal 6 and the output terminal of the output signal of the transistor Q1 at a constant voltage lower than an average voltage drop from the conventional power source line Vcc. By this, it is restricted to a smaller value than an average power consumption caused by a voltage drop from the power source voltage Vcc in the conventional transistor Q1.

As mentioned previously, the amplifier 3 push-pull amplifies the audio signal B by the transistors Q1 and Q2 to perform a power amplification and generates the amplified output signal C. This is true with regard to the amplifier 5, in that the amplifier 5 outputs the output signal C* which is inverted with respect to the output signal C.

The detection circuit 50 is constituted mainly with an NPN transistor Q50 having a detection terminal provided between a base and emitter thereof. Its detection signal E is supplied to the transistor Q61 of the switching regulation circuit 60 to turn ON/OFF the transistor Q62. The transistor Q50 receives at its emitter a voltage of the supply power D and at its base a voltage of the output signal C outputted from the amplifier 3 through forward-connected diodes D51 and D52. As a result, a detecting operation of the detection circuit 50 depends upon whether or not a voltage difference VD–C between the voltage of the supply power D and the voltage of the output signal C is larger than 1 Vf representing the target value (base-emitter forward drop voltage).

When this voltage difference VD–C is not larger than 1 Vf, the transistor Q50 is turned ON. By this, a current corresponding to the detection signal E (=error voltage) of the voltage difference 1 Vf–VD–C is supplied to the transistor Q61. The transistor Q61 generates a voltage which is amplified correspondingly to this error voltage as a voltage-divided voltage F (to be described later). On the other hand, when the voltage difference VD–C is larger than 1 Vf, the transistor Q50 is turned OFF. By this, a detection signal E of constant voltage (=Vcc) is generated. Incidentally, 51 is a constant current source for maintaining the diodes D51 and D52 in ON state and generates a reference signal G which is higher than the output voltage C by 2×1 Vf (=2 Vf) at a base of the transistor Q50.

The control voltage value generating circuit 65 responds to the detection signal E from the detection circuit 50 to generate a comparison voltage value P for the comparator 62. This generates a voltage value between the voltage of the power source line Vcc and the voltage of the output signal C at a junction N between series connected resistor circuits R62 and R63 as the voltage-divided voltage F when the transistor Q61 is turned ON in response to the detection signal E from the detection circuit 50, in other words, when the voltage difference between the voltage of the output signal C and the voltage of the supply power D becomes not larger than 1 Vf.

The amplifier 61 responds to this voltage-divided voltage F to generate the above mentioned comparison voltage value P by amplifying a difference signal between that and the voltage of the reference signal G. And, it outputs that to a (–) input (on the side of a reference terminal) of the comparator 62.

When the transistor Q61 is turned OFF in response to a reception of the detection signal E from the detection circuit 50, that is, when the voltage difference between the voltage of the output signal C and the voltage of the supply power D of the output terminal 6 becomes larger than 1 Vf, the comparison voltage value P is generated by the amplification of the voltage difference (=2 Vf) between the output signal C and the reference signal G by means of the amplifier 61. This becomes a constant value (as will described later, lower value than the signal level of the ramp wave).

The comparator 62 receives at its (+) input a ramp signal S having a constant frequency exceeding an audible frequency from the ramp wave generator circuit 63. And, it compares the voltage of the comparator voltage value P with the voltage of the signal S and outputs a HIGH level signal by which the PNP transistor Q62 is turned OFF as a drive pulse H when the voltage of the signal S exceeds the voltage of the comparison voltage P. This drive pulse H is supplied to the transistor Q62. It should be noted that the ramp signal S is based on the voltage of the reference signal G, and the reference signal G and the signal S are synthesized in a synthesizer circuit 64 before it is inputted to the comparator 62.

The smoothing circuit 70 is connected to an output of the transistor Q62 of the switching circuit 66 and smooths its output power. This circuit includes mainly a coil L70 inserted in series between the output of the transistor Q62 and the power supply line (common output terminal 6 to the amplifiers 3 and 5) to the amplifiers 3 and 5. With the coil L70, power switched is smoothed, resulting in a smoothed supply power D at the output terminal 6. A flywheel diode D70 and change-over switching circuit S70 are successively connected between an input terminal of the coil L70 and an output terminal of the amplifiers 3 and 5. By this, energy stored in the coil L70 when the power supply line is blocked by the switching transistor Q62 is supplied to the side of the amplifiers 3 or 5 as an inertia current and a current circulating path returning to the coil L70 via the loud speaker 4 is formed.

The change-over switching circuit S70 is constituted by such as a transistor switching circuit or an analogue switching circuit, and returns, when an upper half cycle of the audio signal is inputted to the amplifier 3 upon receipt of the signal from the comparator 41, the commutation current flowing into the output terminal of the amplifier 5 from the loud speaker 4 at OFF time of the switching transistor Q62 to the coil L70 from the output terminal at the side of the amplifier 5 via the diode D70. Further, the change-over switching circuit 70 returns, when a lower half cycle of the audio signal is inputted to the amplifier 3, the commutation current flowing into the output terminal of the amplifier 3 from the loud speaker 4 at OFF time of the switching transistor Q62 to the coil L70 from the output terminal at the side of the amplifier 3 via the diode D70.

The comparator 41 is inputted at its reference terminal (−terminal) a reference level voltage Vref representing the center of positive and negative amplitude of the audio signal B, inputted at the other terminal the audio signal B, generates a pulse T corresponding to the upper half cycle of the audio signal B and sends out the same to the change-over switching circuit S70 as a change-over signal. Further, when the audio signal B is a current signal, the voltage of Vcc/2 is applied to the reference terminal of the comparator 41 and either an audio signal B having the center of the magnitude at Vcc/2 or an audio signal B having the center of magnitude at Vcc/2 obtained from the pre-stage side of the signal reproduction processing circuit 2 is inputted at the input side of the comparator 41.

Next, an operation of the switching regulation circuit 60 for controlling the voltage difference VD–C or VD–C* between the supply power D and the output signal C (or the output signal C* from the amplifier 5) to be substantially at 1 Vf will be described.

Figure 2A:
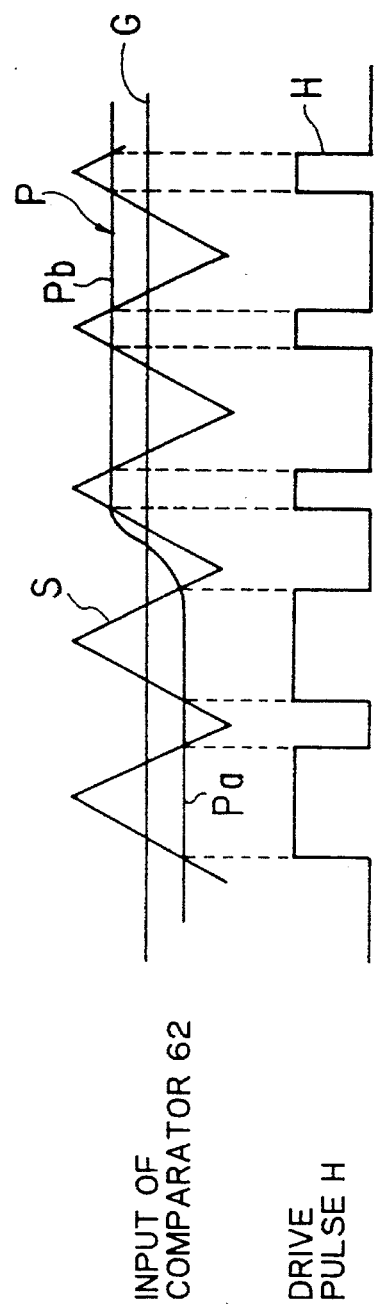
FIGS. 2(a), 2(b) and 2(c) show waveforms for explaining an operation of a supply power control circuit in FIG. 1.
Figure 2B:
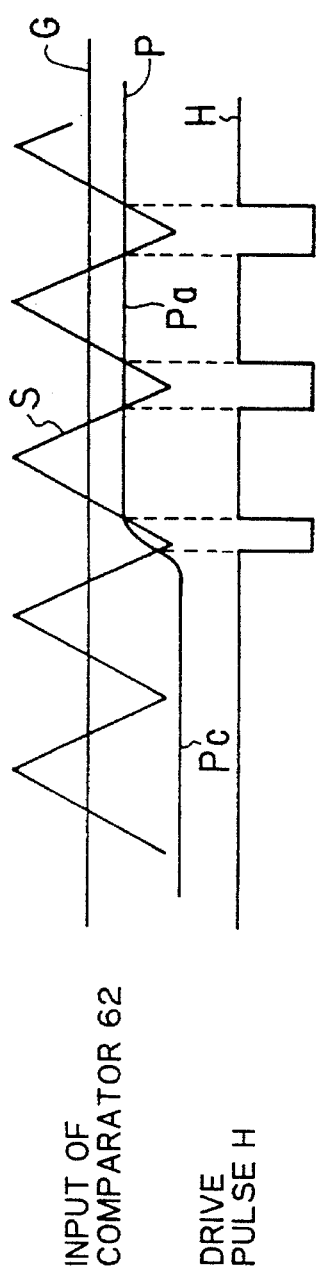

As shown in FIGS. 2(a)–2(b), the comparator 62 receives at one input the ramp signal S having the reference signal G as a reference and at the other input the comparison voltage value P.

When the voltage difference VD–C is not larger than 1 Vf representing the target value, as shown in FIG. 2(a), the comparator 62 generates a binary drive pulse H (see H in FIG. 2(a)) corresponding to a result of the comparison in the level between the ramp signal level (waveform S) and the output signal (waveform P) of the amplifier 61, with which the transistor Q62 is turned ON/OFF. In this case, the level Pa of a forward half of the signal P is lower than the reference signal G. This corresponds to a state where the voltage difference VD–C is maintained at slightly lower than 1 Vf but substantially equal to 1 Vf. The level Pb of a rearward half of the signal P is higher than the reference signal G. In this case, the voltage difference VD–C is lower than 1 Vf. In this case, a time period of the drive pulse H for which the latter is at a HIGH level is short so that an amount of supply power D is increased. By this, it is controlled such that the supply power D is increased to increase its voltage to thereby make the voltage difference VD–C become substantially 1 Vf.

By this, when the voltage difference VD–C is not larger than 1 Vf, the level of the comparison voltage value P is changed in a direction in which difference is made substantially equal to 1 Vf and a current corresponding thereto is supplied to the amplifier 3. And, the voltage difference DV-C becomes substantially 1 Vf representing the target value. That is, the PWM is performed in correspondingly with a result of comparison between the comparison voltage value P and the ramp wave S and the switching transistor Q 62 is ON/OFF controlled by the drive pulse H. Such control is performed correspondingly to the value of the detection signal E.

When the difference between the voltage of the output signal C and the voltage of the supply power D is larger than 1 Vf, the transistor Q50 is turned OFF. In this case, the detection voltage E becomes at the source voltage Vcc. Therefore, the transistor Q61 is turned OFF, generating the voltage difference 2 Vf. As a result, the comparison voltage value P becomes a level Pc shown in FIG. 2(b) and a constant voltage which is lower than the reference signal G by 2 Vf is supplied to the comparator 62. As a result, a drive pulse H such as shown by a high level waveform H in FIG. 2(b) is generated to turn OFF the transistor Q62 of the switching circuit.

Then the power supply is terminated until the voltage difference VD–C reaches substantially to 1 Vf, in other words, so as to bring the difference close to the target value 1 Vf. As a result, the power supply is provided to the amplifier 3 such that the voltage difference VD–C becomes substantially 1 Vf and the comparison voltage value P is returned to the level Pa.

The above mentioned level Pa of the comparison voltage value P is determined by values of the resistors R62 and R63 and is selectable. Further, the above mentioned level Pc of the comparison voltage value P is determined in relation to an amplitude of the ramp wave and this is also selectable. Further, the speed of response to a change in the level of the comparison voltage value P is selected to be high enough with respect to a change of the audio signal in designing the circuit.

As a specific example, when the voltage level of the input signal B is decreased greatly the internal impedance of the transistor Q1 is abruptly increased and the voltage difference between the voltage of the output signal C and the voltage of the supply power D of the output terminal 6 becomes higher than 1 Vf. In this case, the comparison voltage value P becomes lower in level than the ramp wave S as shown by Pc and the drive pulse H of the comparator 62 is maintained at a HIGH level to maintain the transistor Q62 in an OFF state. Such control is performed continuously until the voltage difference between the output signal C and the voltage of the supply power D of the output terminal 6 becomes near 1 Vf.

For example, when the voltage level of the input signal B is increased greatly, the internal impedance of the transistor Q1 is lowered abruptly and the voltage difference between the output signal C and the voltage of the supply power D of the output terminal 6 becomes lower than 1 Vf. In such a case, the comparison voltage value Pb corresponding to an error reducing below 1 Vf is supplied. By this, the control is performed such that the voltage of the supply power D is increased to make a target value of the voltage difference equal to 1 Vf.

Figure 2C:
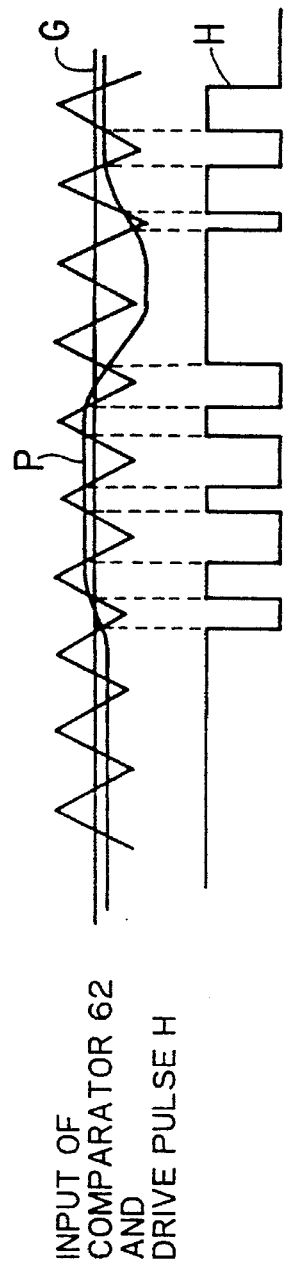

And, for a gentle change of the level of the input signal B, the two controls for the case where it is equal to or not lower than 1 Vf and for the case where it is not higher than 1 Vf are performed alternatively for a short time correspondingly to a change in the internal impedance of the transistor Q1, resulting in alternating pulses including pulses having widths covering a plurality of cycles of the ramp signal S and pulses having shorter widths, as shown in FIG. 2(c).

Frequency of the ramp wave is preferably within a range 100 kHz to 500 kHz in view of the fact that an upper limit of the audible frequency is generally 20 kHz and in view of the case in adjustment and power efficiency of an oscillator circuit.

In this case, 1 Vf (about 0.7 V) of the voltage difference VD–C which is the target value of control is a value determined in correspondence to the fact that the transistor Q1 of the amplifier 3 is a single stage transistor. That is, the voltage difference VD–C between the voltage of the supply power D to the amplifier 3 and the voltage of the output signal C of the amplifier 3 is selected from values which do not degrade the response performance of the transistor Q1 as a value which is as close as possible to a collector-emitter voltage during ON state which is the minimum necessary to allow the amplifier 3 to perform its amplification. Therefore, if the transistor Q1 is composed of Darlington-connected transistors the above mentioned voltage difference VD–C is to be about 2 Vf (about 1.4 V). More specifically another diode is further connected in series to the diodes D51 and 52.

Now, the amplifier 5 is connected to the supply power control circuit 4 via the detection circuit 55 and the output terminal 6. The detection circuit 55 is a circuit like the detection circuit 50 and is OR connected in parallel with the detection circuit 50 via a diode, further the current source 56 for the detection circuit 55 is a circuit corresponding to the current source 51 for the detection circuit.

The detection circuit 55 produces a detection signal E' of which value depends on whether or not the voltage difference VD–C* between the voltage of the supply power D and the output signal voltage C* is larger than 1 Vf. The detection signal E' is isolated from the detection signal E from the detection circuit 50 each other, which is effected because these detection circuits are connected via wired OR connection diodes Di and Di and level shift use diodes $D_L$ and $D_L$. Accordingly, either the detection signal E or the detection signal E' belonging to ON side transistor among transistors Q55 and Q50 is sent out to the transistor Q61 in the switching regulation circuit 60 to constitute the switching control signal.

With this measure, the PWM control in the switching regulation circuit 60 is associated with the voltage difference VD–C* at the side of the amplifier 34 as well as with the voltage difference VD–C. The current supply operation of the respective amplifiers 3 and 5 is as the same manner as above. Since the amplifiers in the circuit perform the BTL operation, the amplifiers 3 and 5 are not activated at the same time but operated alternatively. Accordingly, the control performed by the amplifier 3 is performed in the same way in the amplifier 5 in different period. Since the detection circuits 50 and 55 are connected in parallel, a priority is given to the operation of one of the transistors Q50 and Q55 which is turned ON first. Namely, when the transistor Q1 is turned ON and the transistor Q3 is turned OFF, the detection circuit 50 is turned ON or OFF and a priority is given to the operation of the detection circuit. On the other hand, when the transistor Q1 is turned OFF and the transistor Q3 is turned ON, a priority is given to the operation of the detection circuit 55.

Now, an overall operation of this tape player will be described.

During reproduction, the read signal A of the audio signal is obtained from a tape (not shown), on which the audio signal is recorded, through the read head 1. With respect to this read signal A, the audio signal is obtained by the signal reproducing processing circuit 2. The positive side half cycle among the audio signal B is push-pull amplified by the transistors Q1 and Q4 in the respective amplifiers 3 and 5, and the negative half cycle thereof is push-pull amplified by the transistors Q3 and Q2 in the respective amplifiers 3 and 5.

By this, the input signal B is power-amplified to provide the output signals C and C* by which the loud speaker 4 is driven. In this case, for the upper half cycle, the voltage difference VD–C between the voltage of the supply power D to the amplifier 3 and the voltage of the output signal C of the amplifier 3 is controlled such that it is maintained at the target value of 1 Vf which is close to the minimum value necessary to operate the amplifier 3. In the like manner for the lower half cycle, it is similarly controlled such that the voltage difference VD–C* between the voltage of the supply power D to the amplifier 5 and the voltage of the output signal C* of the amplifier 5 is maintained at the target value of 1 Vf which is close to the minimum value necessary to operate the amplifier 5.

By this, power loss in the amplifiers 3 and 5 is determined by a voltage drop in the order of 1 Vf corresponding to the voltage differences VD–C and VD–C* and the power consumption is reduced compared with the conventional consumption.

Although power loss due to switching of the power supply line is mainly due to resistance when the transistor Q62 is ON as mentioned previously, the power consumption can be restricted practically since the ON resistance value is small. Particularly, since the drive circuit for the PWM control for switching the transistor Q62 can be constituted by an IC circuit having a differential amplifier construction, its power consumption can be restricted to a small value compared with the power consumption in the power amplifier stage.

Figure 3:
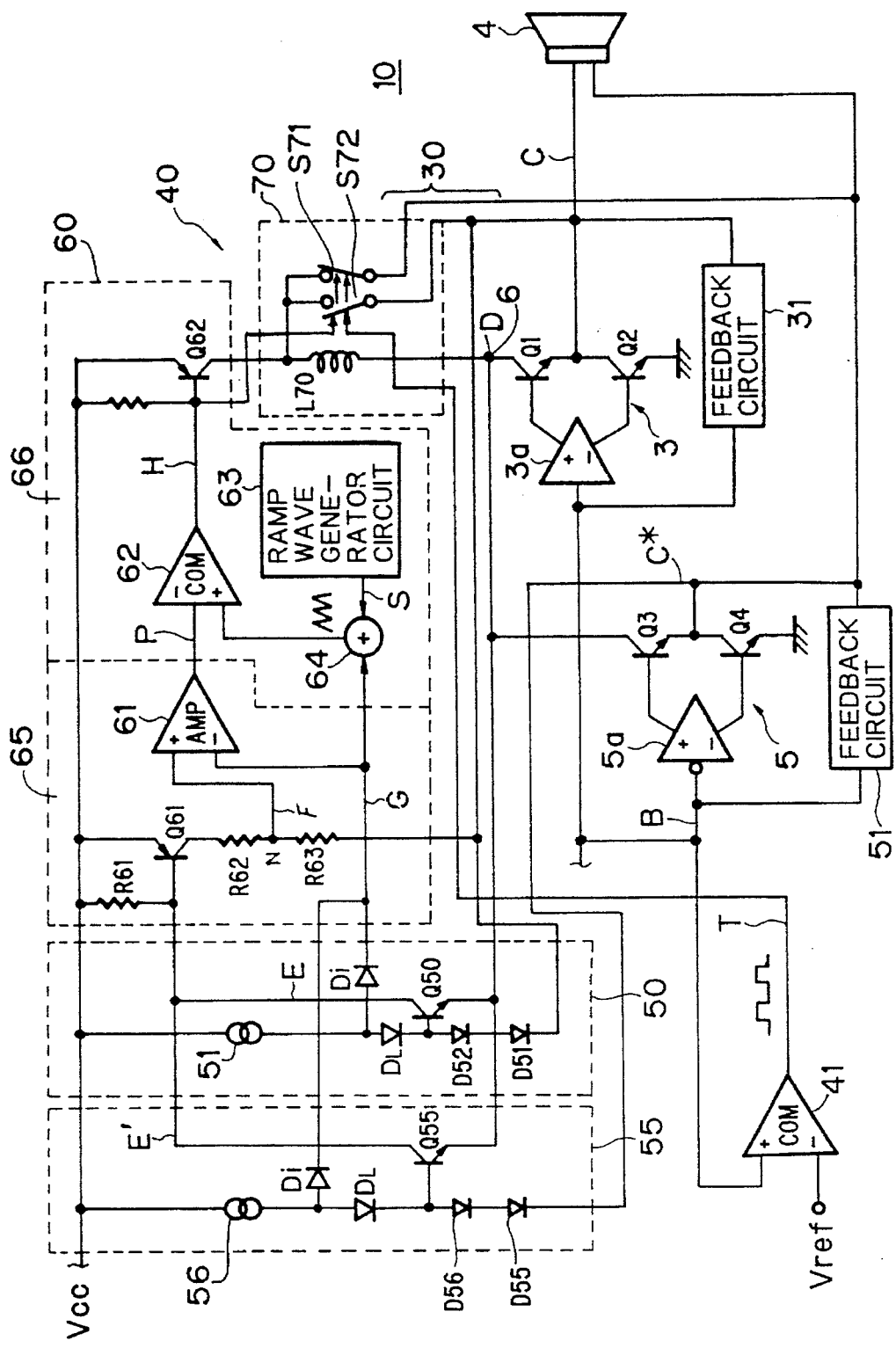
FIG. 3 is a block diagram of an embodiment in which a change-over circuit according to the present invention is replaced by another specific example.

FIG. 3 is a modification of FIG. 1 circuit in which the diode D70 is removed, the change-over switching circuit S70 is constituted by a first switching circuit S71 and a second switching circuit S72 and the respective one ends of the switching circuits S71 and S72 are in common connected to the input terminal side of the coil L70. These switching circuits S71 and S72 are likely constituted either by transistor switching circuits or by analogue switching circuits.

The switching circuit S71 is turned on by the drive pulse H upon receipt of the signal from the comparator 41 when the upper half cycle of the audio signal B is inputted and connects the output terminal at the side of the amplifier 5 with the input side of the coil L70, thereby the circulating current flowing out from the loud speaker 4 to the output terminal of the amplifier 5 is returned to the coil L70 when the switching transistor Q62 is turned OFF. Further, the switching circuit S72, of which ON operation is opposite to that of the switching circuit S72, is turned ON by the drive pulse H when the lower half cycle of the audio signal B is inputted and connects the output terminal at the side of the amplifier 3 with the input side of the coil L70, thereby the circulating current flowing out from the loud speaker 4 to the output terminal of the amplifier 3 is returned to the coil L70 when the switching transistor Q62 is turned OFF.

The operation of FIG. 3 circuit is substantially the same as that of FIG. 1 circuit, the explanation thereof is omitted.

Figure 4:
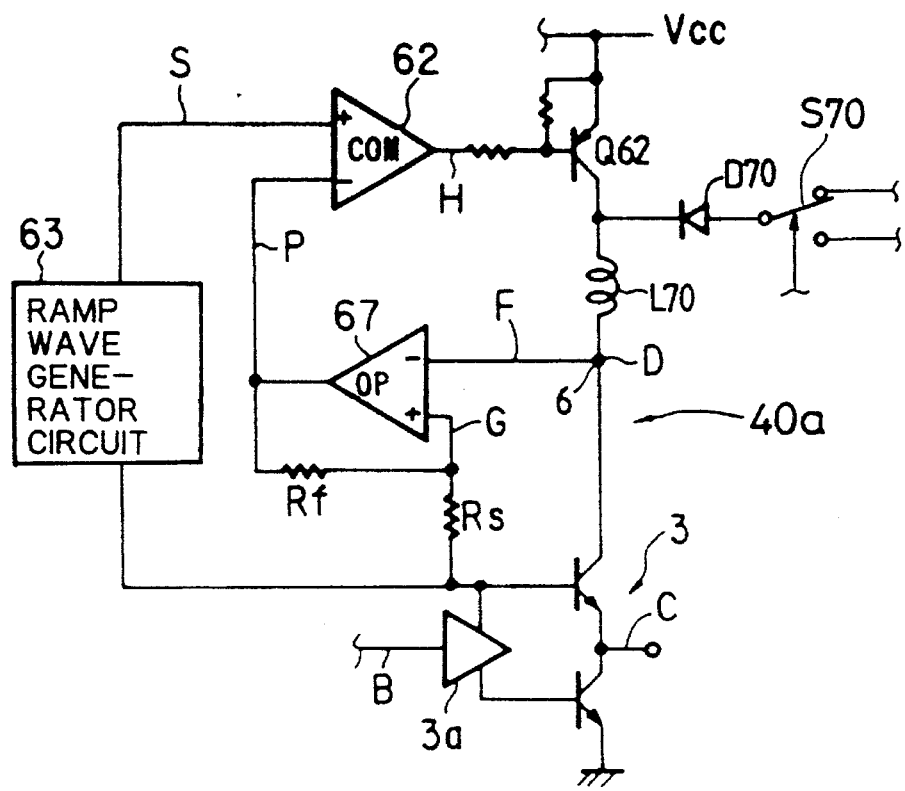
FIG. 4 is a block diagram of, mainly, a supply power control circuit of another embodiment of the present invention when applied to a portable stereo cassette tape player.

FIG. 4 is an embodiment of the supply power control circuit 40a in which one of the voltages to be detected by the detection circuit is changed from the voltage of the output signal C to the voltage of the input signal B.

In FIG. 4, the supply power control circuit 40a performs a control such that the voltages of the output signal C and the supply power D are made constant correspondingly to the voltages of the input signal B and the supply power D.

The same circuit components as those in FIG. 1 are depicted by the same reference numerals respectively in FIG. 4. Since the side of the amplifier 5 is identical as that of the amplifier 3, only the side of the amplifier 3 is illustrated and the illustration of the corresponding side of the amplifier 5 is omitted.

The differences include that a circuit from the detection circuit 50 to the amplifier 61 is replaced by a detection/amplifier circuit 67 constituted by an operational amplifier of inverted amplification type and that the reference signal G is set at the base bias potential of the transistor Q1. Therefore, the ramp wave generator circuit 63 also operates on a reference potential of the base of the transistor Q1.

The detection/amplifier circuit 67 has a (−) input terminal supplied with the voltage of the supply power D and a (+) input terminal supplied with the voltage of the input signal B obtained from the base of the transistor Q1 through a resistor Rs as a reference side potential. That is, the resistor Rs converts a current value of the input signal B into a voltage value so as to correspond to the output signal C and generates a predetermined voltage which is lower by a predetermined value than that of the output signal C. Further, the detection/amplifier circuit 67 includes a feedback resistor Rf connected between an output side thereof and the (+) input terminal. A voltage of an output signal P thereof is sent to a (−) input terminal of the comparator 62 which is a reference input terminal. An output of the ramp wave generator circuit 63 is supplied to the (+) input terminal of the comparator 62. In such a circuit, a divided voltage signal F generated from the detection signal and the supply power D are coincident and the reference signal G becomes the same level due to the fact that the input terminal of the operational amplifier is in a virtual short.

The difference between the voltages of the output signal and the input signal of the output stage amplifier is caused by a level difference therebetween corresponding to the amplification factor of the output stage amplifier. However, there are no phase differences between the input signal and the output signal.

Considering these matters, the same operation as that of the supply power control circuit 40 in the previous embodiment is possible even if taking the input signal B as the object of detection. Therefore, the both circuits are replaceable each other.

Figure 5:
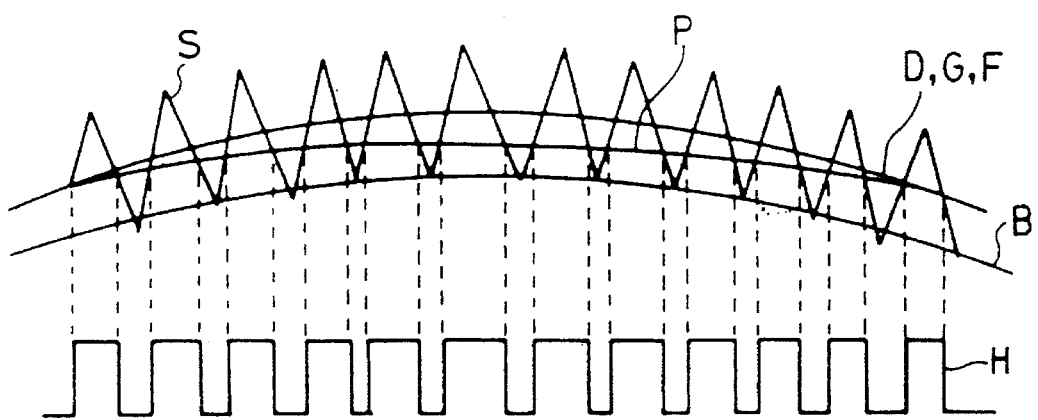
FIG. 5 shows waveforms for an explanation of the operation of the supply power control circuit in FIG. 4.

The frequency of the ramp signal S is much different from that of the input signal B. FIG. 5 explains the operation principle thereof with the frequency of the ramp signal S being lowed in relation to the signal B.

Waveforms (see FIG. 5) of the ramp signal S and the reference signal P are obtained correspondingly to the input signal B, and PWM pulse corresponding to the width of the ramp wave exceeding the reference signal P is supplied to the transistor Q62. As a result, in relation to the output signal C, the PWM control is performed with the waveform relation shown by H in FIG. 5.

Although, in the above mentioned embodiment, a reproduced signal from a tape player has been described as an example, other audio signals such as microphone input or broadcasted signal, etc may be used as the input signal. In such case, the signal reproduction processing circuit may be a preamplifier to be inserted into an upstream of the output stage amplifier.

Further, although the example in which the amplified signal is sent to a loud speaker has been described, the present invention is not limited thereto. For example, such signal may be used as an input to a recording circuit or to a larger power amplifier.

Although the transistor Q50 in the detection circuit 50 is an NPN transistor, it may be a PNP transistor. In such case, the emitter thereof receives the output signal C and the base thereof receives the voltage signal of the supply power D.

If a larger current capacity is required, the mere high frequency by-passing capacitor CN between the output terminal 6 of the supply power D and the ground GND may be replaced by a smoothing capacitor having larger capacity.

Figure 6:
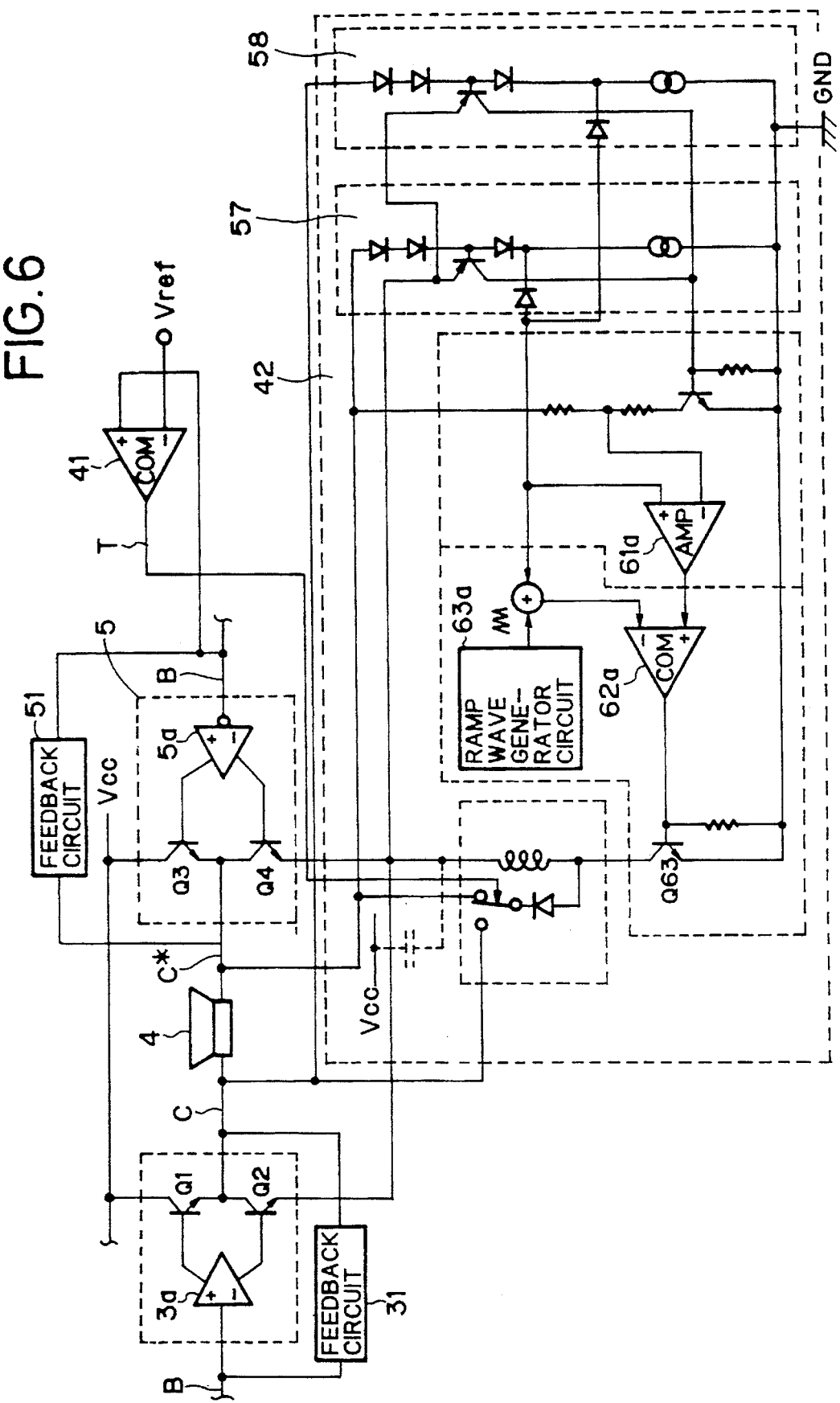
FIG. 6 is a block circuit diagram of another embodiment of the present invention corresponding to the embodiment in FIG. 1, with a supply power control circuit being provided on the side of ground.

FIG. 6 shows an embodiment corresponding to the embodiment shown in FIG. 1, in which a supply power control circuit 42 is provided between the transistors Q2 and Q4 and the ground, respectively.

The supply power control circuit 42 has a similar circuit construction but differs from the supply power control circuit 40 in that the NPN (PNP) transistors of the supply power control circuit 40 are replaced by PNP (NPN) transistors and that the power source line Vcc and the ground are inverted by reversing the connection of the terminal of the comparator on the input side and connection of the terminal on the input side of the operational amplifier. 57 and 58 are respectively the detection circuits and correspond respectively to the detection circuits 50 and 55. The NPN transistor Q63 is a switching transistor and corresponds to the PNP transistor Q62. An amplifier 61a corresponds to the amplifier 61, a comparator 62a corresponds to the comparator 62 and a ramp wave generator circuit 63a corresponds to the ramp wave generator circuit 63. Its operation is just opposite to the previously described operation in that only the polarity thereof is opposite and therefore the explanation of the details thereof is omitted.

In this instance the object of the present control is the current power returned from the amplifier to ground.

Further, through combining the FIG. 1 embodiment with the FIG. 3 embodiment the supply power control circuit 40 and the supply power control circuit 42 can be respectively provided at the power source side and at the ground side, which can be completed simply by combining the both circuits in FIG. 1 and FIG. 3, therefore the illustration thereof is omitted.

For the supply power control circuit 40a shown in FIG. 4, it can be used as a similar one to the supply power control circuit 42 by making the power source line Vcc and the ground GND reversed by similarly reversing the connection of the terminals of the comparator 62 and the operational amplifier 67.

Figure 7:
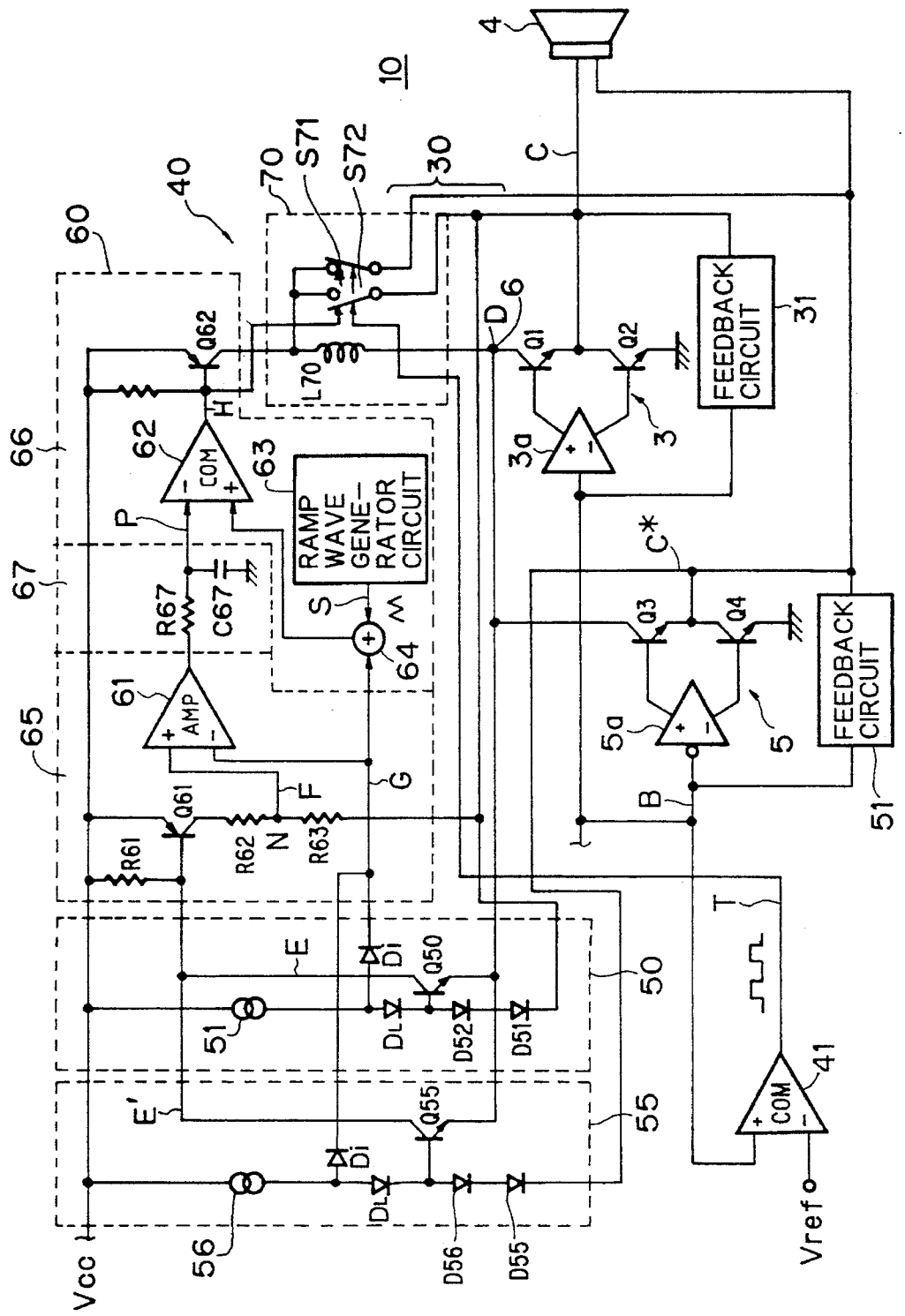
FIG. 7 is a block diagram of another embodiment of the present invention corresponding to the embodiment in FIG. 3 in which a low pass filter is inserted between the switching control signal and the comparator to thereby reduce the high frequency distortion.

FIG. 7 is an embodiment in which the distortions in high frequency region is improved. In FIG. 3 embodiment, for example, the follow-up characteristic of the voltage of the supply power with respect to output voltage for audio signals in a high frequency region over 2000 Hz is deteriorated, and signal distortion is caused. Thereby, by preventing the follow-up of the supply power at the high frequency region the signal distortion in the high frequency region is improved. For this purpose, in the embodiment in FIG. 7, a low pass filter 67 is inserted between the amplifier 61 which generates the switching control signal and the comparator 62 which generates the switching drive signal. This filter 67 is constituted by a resistor R67 and a capacitor C67, and is a low pass filter having cut-off frequency of 200 Hz. Accordingly, with the present embodiment a follow-up control in which the voltage of the supply power is maintained higher by the target value 1 Vf with respect to the output voltage fundamentally for the audio signals below 200 Hz. The cut-off frequency of the filter can be of course selected either higher than the above, for example about 2000 Hz or lower than the above. Like the embodiment in FIG. 7, a similar low pass filter can be provided between the amplifier 61a and the comparator 62a in the embodiment in FIG. 6.

Figure 8:
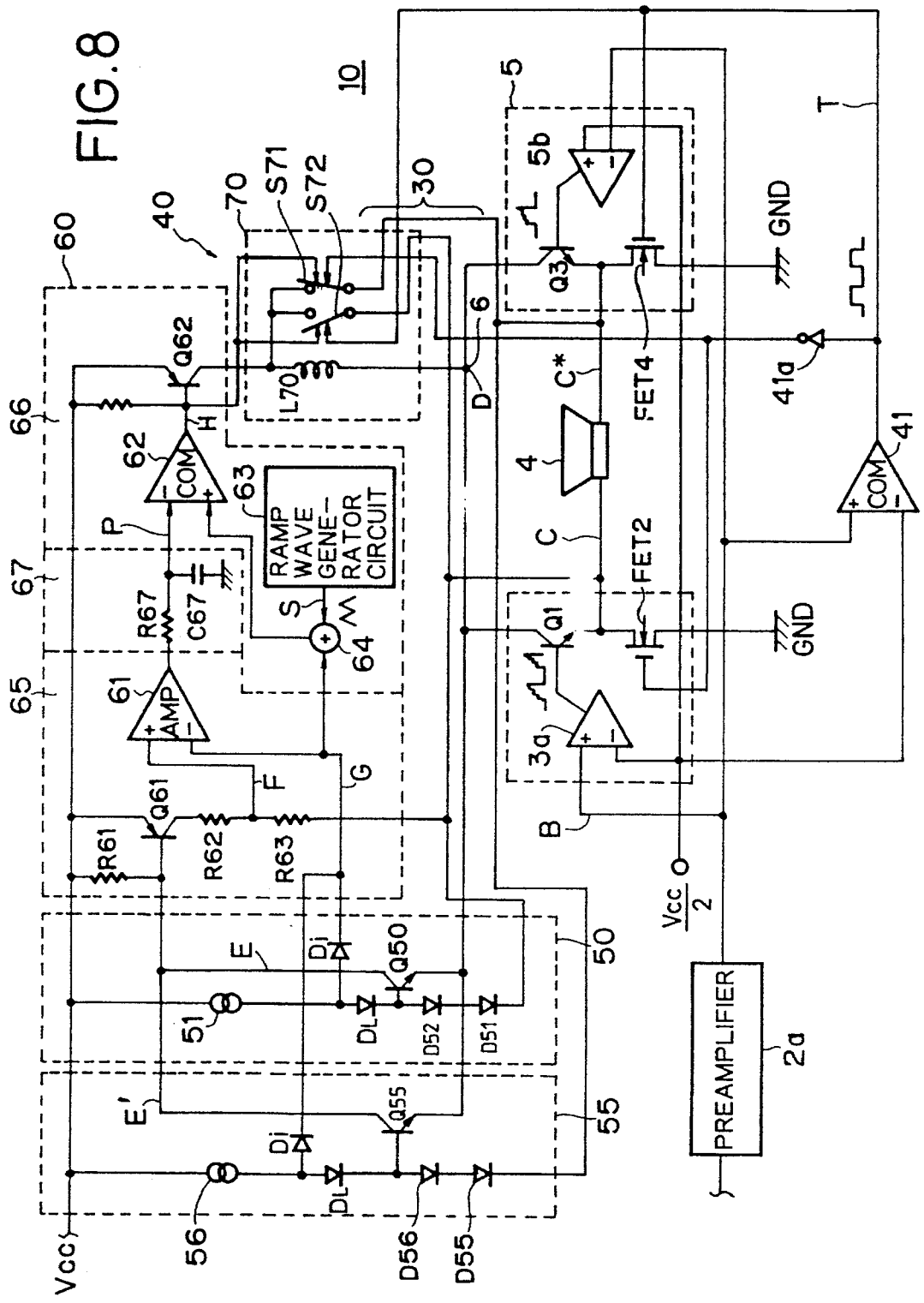
FIG. 8 is a block diagram of another embodiment of the present invention corresponding to the embodiment in FIG. 3 in which an FET transistor is used of the transistor at pull side in the output stage push-pull circuit to thereby reduce the distortion.

FIG. 8 is a modification of FIG. 7 embodiment in which the bipolar transistors Q2, Q4 in the pull side of the amplifiers 3 and 5 are replaced by N type FET transistors FET2 and FET4, and which is designed so that the transistors at the pull side are operated under ON sat condition (ON condition in saturation region).

When the bipolar transistors are replaced by the FET transistors as in the present embodiment, the power consumption will increase because the ON resistance of the FET transistors are larger than that of the bipolar transistors, however, the resistance value of the FET transistor during ON sat condition is hardly affected by the load current flowing from the source to the drain, thereby the signal distortion can be reduced.

The transistor FET4 receives at its gate the output from the comparator, and the transistor FET2 receives at its gate the output from the comparator 41 via an inverter 41a. Further, the output of the inverter 41a is applied to the switching circuit S71 and the output of the comparator 41 is applied to the switching circuit S72. At the same time, the (−) input of the comparator 41, the (−) input of the input stage amplifier 3a and the (+) input of the input stage amplifier 5b receive the voltage Vcc/2. The audio signals B are applied to the (+) input of the input stage amplifier 3a and (−) input of the input stage amplifier 5b.

As a result, the transistor FET4 is turned ON during the positive half cycle of the audio signal B, the transistor FET2 is turned ON during the negative half cycle of the audio signal B and the both transistors are alternatively held in the ON sat condition thereby the signal distortion is improved.

Further, 2a is a preamplifier inserted at the position of the signal processing circuit 2, and the feedback circuits 31 and 51 are omitted like the conventional embodiment in FIG. 9.

We claim:

1. A power amplifier circuit for an audio signal comprising:

a first amplifier for amplifying an audio signal;

a second amplifier for amplifying the audio signal;

a first switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of power supplied from a power source line in accordance with an output of said comparator for feeding power to one of said first amplifier and said second amplifier;

a smoothing circuit having a coil provided between the feed power output of said first switching circuit and a terminal of one of said first amplifier and said second amplifier for receiving a feed power;

a second switching circuit for forming a circulating path in accordance with the half cycle of said audio signal to supply one of said first amplifier and said second amplifier with a current of said coil in a period when said switching transistor is in an OFF state; and a control circuit including a control voltage value generator circuit for generating a voltage value corresponding to a voltage difference between a voltage signal of the feed power and a selected voltage of one of a first output signal of said first amplifier and a second output signal of said second amplifier as the control signal and supplying the voltage value to said another input of said comparator to control the comparator output for controlling a switching period of said switching transistor such that the voltage difference between the voltage of one of said first output signal and said second output signal and the voltage of the feed power becomes substantially constant.

2. The power amplifier circuit for an audio signal claimed in claim 1, wherein said control circuit includes a transistor responsive to the voltage signal of the feed power for generating a detection signal corresponding to a difference in voltage between the voltage difference and a predetermined voltage, and wherein said control voltage value generator circuit responds to the detection signal to generate the voltage value to thereby control the voltage difference to be substantially equal in potential to said predetermined voltage.

3. The power amplifier circuit for an audio signal claimed in claim 1, wherein said first and second amplifiers are amplifiers of which output stages are in a push-pull connection, said second switching circuit includes a diode of which one terminal is connected to said coil and a two inputs and one output change-over circuit to the output of which the other terminal of said diode is connected and of which two inputs are respectively connected to the output of said first amplifier and the output of said second amplifier.

4. The power amplifier circuit for an audio signal claimed in claim 3, wherein said second switching circuit further includes a change-over signal generating circuit which sends out a change-over control signal to said change-over circuit in response to either of the upper or lower half cycle of the audio signal, and said change-over circuit performs a change-over connection so as to return a circulating current flowing out from a loud speaker to the output of said second amplifier to said coil or a circulating current flowing out from said loud speaker to the output of said first amplifier to said coil depending on the change-over control signal.

5. The power amplifier circuit for an audio signal claimed in claim 1, wherein said first and second amplifiers are amplifiers of which output stages are in a push-pull connection, said second switching circuit includes first and second switch circuits of which one terminals are connected in common to said coil and the remaining terminal of said first switch is connected to the output of said first amplifier and the remaining terminal of said second switch is connected to the output of said second amplifier.

6. The power amplifier circuit for an audio signal claimed in claim 5, wherein said second switching circuit further includes a change-over signal generating circuit which sends out a change-over control signal to said change-over circuit in response to either of the upper or lower half cycle of the audio signal, and said first switch circuit turns on in response to said output of the comparator and the change-over control signal so as to return a circulating current flowing out from a loud speaker to the output of said first amplifier to said coil and said second switch circuit turns on in response to said output of the comparator and the opposite signal of the change-over signal of said first switch circuit so as to return a circulating current flowing out from said loud speaker to the output of said second amplifier to said coil.

7. The power amplifier circuit for an audio signal claimed in claim 1, wherein said first and second amplifiers are amplifiers of which output stages are in a push-pull connection, the control signal is applied to said comparator via a low pass filter and the pull side of said push-pull amplifier is constituted by a FET transistor.

8. The power amplifier circuit for an audio signal claimed in claim 1, wherein said control circuit includes a transistor responsive to the voltage signal of the feed power received in one of an emitter and a base thereof and said selected voltage received in the other of the base and the emitter for generating a detection signal corresponding to a difference in voltage between the voltage difference and a predetermined voltage, and wherein said control voltage value generator circuit responds to the detection signal to generate the voltage value to thereby control the voltage difference to be substantially equal in potential to said predetermined voltage which is approximately a minimum voltage necessary to operate said amplifier.

9. The power amplifier circuit for an audio signal claimed in claim 8, wherein said selected voltage received in the other of the emitter and the base is passed through a diode circuit which generates said predetermined voltage.

10. The power amplifier circuit for an audio signal claimed in claim 9, wherein said diode circuit comprises at least two diodes.

11. A device for amplifying an audio signal and supplying an amplified signal to a speaker, comprising:

a preamplifier for amplifying an audio signal;

a first output stage push-pull amplifier for amplifying the audio signal amplified by said preamplifier and supplying it to said speaker;

a second output stage push-pull amplifier for amplifying the audio signal amplified by said preamplifier and supplying it to said speaker;

a first switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of power supplied from a power source line in accordance with an output of said comparator and for feeding power to said first and second amplifiers;

a smoothing circuit having a coil provided between the feed power output of said first switching circuit and respective terminals of said first and second amplifiers for receiving a feed power;

a second switching circuit for forming a circulating path, in accordance with the half cycle of said audio signal to supply said first and second amplifiers with a current of said coil in a period when said switching transistor is in an OFF state; and a control circuit including a control voltage value generator circuit for generating a voltage value corresponding to a voltage difference between a voltage signal of the feed power and a voltage of one of a first output signal of said first amplifier and a second output signal of said second amplifier as the control signal and supplying the voltage value to said another input of said comparator to control the comparator output for controlling a switching period of said switching transistor such that the voltage difference between the voltage of one of said first output signal and said second output signal and the voltage of the feed power becomes substantially constant.

12. A power amplifier circuit for an audio signal, comprising:

a first push-pull amplifier for amplifying an audio signal;

a second push-pull amplifier for amplifying the audio signal;

a first switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of current from one of said first amplifier and said second amplifier to a ground in accordance with an output of said comparator for grounding the current;

a smoothing circuit having a coil provided between an input of said first switching circuit for receiving the current and a terminal of one of said first amplifier and said second amplifier for passing the current to said ground;

a second switching circuit for forming a circulating path in accordance with the half cycle of said audio signal to supply one of said first amplifier and said second amplifier with a current of said coil in a period when said switching transistor is in an OFF state; and a control circuit including a control voltage value generator circuit for generating a voltage value corresponding to a voltage difference between a voltage signal of the current from one of said first amplifier and said second amplifier and a voltage of a pull output signal of one of said first amplifier and said second amplifier as the control signal and supplying the voltage to said another input of said comparator to control the comparator output for controlling a switching period of said switching transistor such that the voltage difference between the voltage of said pull output signal and the voltage of the current from said one of said first amplifier and said second amplifier becomes substantially constant.

13. A device for amplifying an audio signal and supplying an amplified signal to a speaker, comprising:

a preamplifier for amplifying an audio signal;

a first push-pull amplifier for amplifying an audio signal;

a second push-pull amplifier for amplifying the audio signal;

a first switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of current from one of said first amplifier and said second amplifier to a ground in accordance with an output of said comparator for grounding the current;

a smoothing circuit having a coil provided between an input of said first switching circuit for receiving the current and a terminal of one of said first amplifier and said second amplifier for passing the current to said ground;

a second switching circuit for forming a circulating path in accordance with the half cycle of said audio signal to supply one of said first amplifier and said second amplifier with a current of said coil in a period when said switching transistor is in an OFF state; and a control circuit including a control voltage value generator circuit for generating a voltage value corresponding to a voltage difference between a voltage signal of the current from one of said first amplifier and said second amplifier and a voltage of a pull output signal of one of said first amplifier and said second amplifier as the control signal and supplying the voltage to said another input of said comparator to control the comparator output for controlling a switching period of said switching transistor such that the voltage difference between the voltage of said pull output signal and the voltage of the current from said one of said first amplifier and said second amplifier becomes substantially constant.

* * * * *